US008399878B2

(12) United States Patent
Hieslmair et al.

(10) Patent No.: US 8,399,878 B2
(45) Date of Patent: Mar. 19, 2013

(54) SILICON/GERMANIUM OXIDE PARTICLE INKS AND PROCESSES FOR FORMING SOLAR CELL COMPONENTS AND FOR FORMING OPTICAL COMPONENTS

(75) Inventors: Henry Hieslmair, San Francisco, CA (US); Shivkumar Chiruvolu, San Jose, CA (US); Hui Du, Sunnyvale, CA (US)

(73) Assignee: NanoGram Corporation, Milpitas, CA (US)

( * ) Notice: Subject to any disclaimer, the term of this patent is extended or adjusted under 35 U.S.C. 154(b) by 0 days.

(21) Appl. No.: 13/595,234

(22) Filed: Aug. 27, 2012

(65) Prior Publication Data

US 2012/0318168 A1    Dec. 20, 2012

Related U.S. Application Data

(60) Continuation of application No. 13/191,392, filed on Jul. 26, 2011, now Pat. No. 8,263,423, which is a continuation of application No. 13/011,596, filed on Jan. 21, 2011, now Pat. No. 7,993,947, which is a division of application No. 12/006,459, filed on Jan. 2, 2008, now Pat. No. 7,892,872.

(60) Provisional application No. 60/878,239, filed on Jan. 3, 2007.

(51) Int. Cl.
*H01L 33/00* (2010.01)
*H01L 29/786* (2006.01)

(52) U.S. Cl. ............... 257/19; 257/65; 257/E33.017; 257/E33.039; 257/E29.297; 438/933; 977/773

(58) Field of Classification Search .............. 257/19, 257/65, E33.017, E33.039, E29.297; 438/933; 977/773, 774
See application file for complete search history.

(56) References Cited

U.S. PATENT DOCUMENTS

| 3,406,228 A | 10/1968 | Hardy et al. |
| 3,954,945 A | 5/1976 | Lange et al. |
| 4,048,290 A | 9/1977 | Lee |
| 4,104,091 A | 8/1978 | Evans, Jr. et al. |
| 4,330,358 A | 5/1982 | Grabmaier et al. |
| 4,390,743 A | 6/1983 | Dahlberg |
| 4,478,879 A | 10/1984 | Baraona et al. |
| 4,786,477 A | 11/1988 | Yoon et al. |
| 4,947,219 A | 8/1990 | Boehm |
| 5,132,248 A | 7/1992 | Drummond et al. |
| 5,262,357 A | 11/1993 | Alivisatos et al. |

(Continued)

FOREIGN PATENT DOCUMENTS

| JP | 05-254883 | 10/1993 |
| JP | 05-261267 | 10/1993 |

(Continued)

OTHER PUBLICATIONS

Goldstein et al., "Observation of Melting in 30 Å Diameter CdS Nanocrystals", Mat. Res. Sco. Symp. Proc., 206:271-274 (1991).

(Continued)

*Primary Examiner* — Thanh V Pham
(74) *Attorney, Agent, or Firm* — Dardi & Herbert, PLLC; Peter S. Dardi; Nikhil Patel

(57) ABSTRACT

Highly uniform silica nanoparticles can be formed into stable dispersions with a desirable small secondary particle size. The silica particles can be surface modified to form the dispersions. The silica nanoparticles can be doped to change the particle properties and/or to provide dopant for subsequent transfer to other materials. The dispersions can be printed as an ink for appropriate applications. The dispersions can be used to selectively dope semiconductor materials such as for the formation of photovoltaic cells or for the formation of printed electronic circuits.

12 Claims, 4 Drawing Sheets

U.S. PATENT DOCUMENTS

| | | | |
|---|---|---|---|
| 5,374,413 | A | 12/1994 | Kim et al. |
| 5,429,708 | A | 7/1995 | Linford et al. |
| 5,489,449 | A | 2/1996 | Umeya et al. |
| 5,491,114 | A | 2/1996 | Goldstein |
| 5,559,057 | A | 9/1996 | Goldstein |
| 5,576,248 | A | 11/1996 | Goldstein |
| 5,599,529 | A | 2/1997 | Cowie |
| 5,683,501 | A | 11/1997 | Tomihisa et al. |
| 5,695,617 | A | 12/1997 | Graiver et al. |
| 5,850,064 | A | 12/1998 | Goldstein |
| 5,866,471 | A | 2/1999 | Beppu et al. |
| 5,902,569 | A | 5/1999 | Oshima et al. |
| 5,908,698 | A | 6/1999 | Budd |
| 6,007,869 | A | 12/1999 | Schreieder et al. |
| 6,086,945 | A | 7/2000 | Kamata et al. |
| 6,100,464 | A | 8/2000 | Priesemuth |
| 6,221,726 | B1 | 4/2001 | Weiner |
| 6,268,041 | B1 | 7/2001 | Goldstein |
| 6,281,427 | B1 | 8/2001 | Mitsuhiro et al. |
| 6,287,925 | B1 | 9/2001 | Yu |
| 6,329,058 | B1 | 12/2001 | Arney et al. |
| 6,348,295 | B1 | 2/2002 | Griffith et al. |
| 6,403,382 | B1 | 6/2002 | Zhu et al. |
| 6,416,721 | B1 | 7/2002 | Sanjurjo et al. |
| 6,471,930 | B2 | 10/2002 | Kambe et al. |
| 6,531,191 | B1 | 3/2003 | Notenboom |
| 6,552,405 | B2 | 4/2003 | Sugawara et al. |
| 6,585,947 | B1 | 7/2003 | Nayfeh et al. |
| 6,586,785 | B2 | 7/2003 | Flagan et al. |
| 6,599,631 | B2 | 7/2003 | Kambe et al. |
| 6,712,999 | B2 | 3/2004 | Haering et al. |
| 6,726,990 | B1 | 4/2004 | Kumar et al. |
| 6,752,979 | B1 | 6/2004 | Talbot et al. |
| 6,794,265 | B2 | 9/2004 | Lee et al. |
| 6,846,565 | B2 | 1/2005 | Korgel et al. |
| 6,849,334 | B2 | 2/2005 | Horne et al. |
| 6,878,184 | B1 | 4/2005 | Rockenberger et al. |
| 6,881,490 | B2 | 4/2005 | Kambe et al. |
| 6,911,385 | B1 | 6/2005 | Haubrich et al. |
| 6,918,946 | B2 | 7/2005 | Korgel et al. |
| 6,998,288 | B1 | 2/2006 | Smith et al. |
| 7,001,578 | B2 | 2/2006 | Nayfeh et al. |
| 7,029,632 | B1 | 4/2006 | Weidhaus et al. |
| 7,038,655 | B2 | 5/2006 | Herb et al. |
| 7,045,851 | B2 | 5/2006 | Black et al. |
| 7,057,206 | B2 | 6/2006 | Halik et al. |
| 7,067,069 | B2 | 6/2006 | Shiho et al. |
| 7,067,337 | B2 | 6/2006 | Yudasaka et al. |
| 7,078,276 | B1 | 7/2006 | Zurcher et al. |
| 7,135,350 | B1 | 11/2006 | Smith et al. |
| 7,173,180 | B2 | 2/2007 | Shiho et al. |
| 7,229,859 | B2 | 6/2007 | Yudasaka et al. |
| 7,267,721 | B2 | 9/2007 | Kauzlarich et al. |
| 7,384,680 | B2 | 6/2008 | Bi et al. |
| 7,473,443 | B2 | 1/2009 | Matsuki et al. |
| 7,494,903 | B2 | 2/2009 | Kahen |
| 7,521,340 | B2 | 4/2009 | Lemmi et al. |
| 7,575,784 | B1 | 8/2009 | Bi et al. |
| 7,615,393 | B1 | 11/2009 | Shah et al. |
| 7,852,435 | B2 | 12/2010 | Fujisawa et al. |
| 2002/0074547 | A1 | 6/2002 | Yudasaka et al. |
| 2003/0031438 | A1 | 2/2003 | Kambe et al. |
| 2003/0045632 | A1 | 3/2003 | Shiho et al. |
| 2003/0203205 | A1 | 10/2003 | Bi et al. |
| 2004/0036130 | A1 | 2/2004 | Lee et al. |
| 2005/0008880 | A1 | 1/2005 | Kunze et al. |
| 2005/0145163 | A1 | 7/2005 | Matsuki et al. |
| 2005/0170192 | A1 | 8/2005 | Kambe et al. |
| 2006/0001726 | A1 | 1/2006 | Kodas et al. |
| 2006/0094189 | A1 | 5/2006 | Zurcher et al. |
| 2006/0137567 | A1 | 6/2006 | Yadav |
| 2006/0157677 | A1 | 7/2006 | Kunze et al. |
| 2006/0237719 | A1 | 10/2006 | Colfer et al. |
| 2007/0003694 | A1 | 1/2007 | Chiruvolu et al. |
| 2007/0094757 | A1 | 4/2007 | Pridohl et al. |
| 2007/0151598 | A1 | 7/2007 | DeCeuster et al. |
| 2008/0083926 | A1 | 4/2008 | Ostergard |
| 2008/0138966 | A1 | 6/2008 | Rogojina et al. |
| 2008/0152938 | A1 | 6/2008 | Kelman et al. |
| 2008/0171425 | A1 | 7/2008 | Poplavskyy et al. |
| 2008/0191193 | A1 | 8/2008 | Li et al. |
| 2008/0202576 | A1 | 8/2008 | Hieslmair |
| 2008/0220175 | A1 | 9/2008 | Mangolini et al. |
| 2008/0305619 | A1 | 12/2008 | Lemmi et al. |
| 2009/0026421 | A1 | 1/2009 | Li et al. |
| 2009/0263977 | A1 | 10/2009 | Rogojina et al. |
| 2009/0269913 | A1 | 10/2009 | Terry et al. |
| 2011/0318905 | A1* | 12/2011 | Chiruvolu et al. ............ 438/478 |

FOREIGN PATENT DOCUMENTS

| | | |
|---|---|---|
| JP | 06-091162 | 4/1994 |
| JP | 06-142496 | 5/1994 |
| JP | 07-008792 | 1/1995 |
| JP | 10-45409 A | 2/1998 |
| JP | 2000-219901 | 8/2000 |
| JP | 2000-282222 | 10/2000 |
| WO | 01/32799 A1 | 5/2001 |
| WO | 2005/013337 | 2/2005 |
| WO | 2005/049492 | 6/2005 |
| WO | 2006/009881 | 1/2006 |
| WO | 2007/023362 | 3/2007 |
| WO | 2007/072162 | 6/2007 |
| WO | 2007/117265 | 10/2007 |
| WO | 2008/030966 | 3/2008 |
| WO | 2008/039757 | 4/2008 |
| WO | 2008/061131 | 5/2008 |
| WO | 2008/073763 | 6/2008 |
| WO | 2008/091393 | 7/2008 |
| WO | 2008/118865 | 10/2008 |
| WO | 2008/137738 | 11/2008 |
| WO | 2008/143716 | 11/2008 |
| WO | 2008/152272 | 12/2008 |
| WO | 2009/032359 | 3/2009 |
| WO | 2009/114026 | 9/2009 |
| WO | 2009/117007 | 9/2009 |

OTHER PUBLICATIONS

Cannon et al, "Sinterable Ceramic Powders from Laser-Driven Reaction: I, Process Description and Modeling," J. Am. Ceramic Society 65 (7):324-329 (1982).

Cannon et al, "Sinterable Ceramic Powders from Laser-Driven Reaction: II, Powder Characteristics and Process Variables," J. Am. Ceramic Society 65(7):330-335 (1982).

Thomas, "The Determination of Log Normal Particle Size Distributions by Dynamic Light Scattering", Journal of Colloid and Interface Science, 117(1):187-192 (May 1987).

European Search Report (EP08712916.9) dated Aug. 5, 2011 (13 pages).

* cited by examiner

SILICON/GERMANIUM OXIDE PARTICLE INKS AND PROCESSES FOR FORMING SOLAR CELL COMPONENTS AND FOR FORMING OPTICAL COMPONENTS

CROSS REFERENCE TO RELATED APPLICATIONS

The application is a continuation of U.S. patent application Ser. No. 13/191,392, filed Jul. 26, 2011, now U.S. Pat. No. 8,263,423 to Hieslmair et al., entitled "Silicon/Germanium Oxide Particle Inks and Processes for Forming Solar Cell Components and for Forming Optical Components," which is a continuation of U.S. patent application Ser. No. 13/011,596, filed Jan. 21, 2011, now U.S. Pat. No. 7,993,947 to Hieslmair et al., entitled "Silicon/Germanium Oxide Particle Inks, Inkjet Printing and Processes for Doping Semiconductor Substrates," which is a divisional of U.S. patent application Ser. No. 12/006,459, filed Jan. 2, 2008, now U.S. Pat. No. 7,892,872, to Hieslmair et al, entitled "Silicon/Germanium Oxide Particle Inks, Inkjet Printing and Processes for Doping Semiconductor Substrates", which claims priority to U.S. Provisional Patent Application Ser. No. 60/878,239 filed on Jan. 3, 2007 to Hieslmair et al., entitled "Doped Dispersions and Processes for Doping Semiconductor Substrates," incorporated herein by reference.

FIELD OF THE INVENTION

The invention relates to dispersions/inks of silica/germania particles, such as doped silica particles. The invention further relates to inks that are suitable for ink jet printing. Additionally, the invention relates to the use of doped silica/germania particles for the doping of semiconductor substrates, such as through the drive in of dopants with heat and/or light from a silica/germania deposit formed through inkjet printing onto the semiconductor surface.

BACKGROUND OF THE INVENTION

The formation of semiconductor devices generally involves the formation of doped regions in which the dopants alter the electrical conduction properties or other desired properties. Through the selected doping process different domains can be formed in the material that provide functionalities for particular semiconductor devices. For example, some dopants provide excess electrons that can populate the conduction bands, and the resulting materials are referred to as n-type semiconductors. Other dopants provide holes and are used to form p-type semiconductors. Additional dopants can provide other functionalities, such as optical emissions. Through appropriate doping, a wide range of devices can be formed, such as transistors, diodes and the like.

With increasing costs and undesirable environmental effects from the use of fossil fuels and other non-renewable energy sources, there are growing demands for alternative forms of energy. Various technologies are available for the formation of photovoltaic cells, i.e., solar cells. A majority of commercial photovoltaic cells are based on silicon. Increased commercialization of alternative energy sources relies on increasing cost effectiveness through lower costs per energy unit. Thus, for a photovoltaic cell, the objective would be to increase energy conversion efficiency for a given light fluence and/or to lower the cost of producing a cell.

SUMMARY OF THE INVENTION

In a first aspect, the invention relates to a dopant ink composition suitable for ink jet printing, the ink comprising a stable dispersion of silica/germania nanoparticles in a dispersing liquid with a concentration of silica/germania nanoparticles from about 0.1 weight percent to about 20 weight percent. The silica/grmania nanoparticles can have an average primary particle size of no more than about 100 nm, and the dopant ink generally has a viscosity from about 0.1 mPa·s to about 100 mPa·s.

In a further aspect, the invention relates to a dispersion comprising a liquid and doped silica/germania nanoparticles. In some embodiments, the doped silica/germania nanoparticles having an average primary particle size from about 1 nm to about 100 nm and a volume-average particle size of no more than about 500 nm. The dispersion can have a concentration of doped silica/germania nanoparticle from about 0.1 weight percent to about 20 weight percent doped silica/germania nanoparticles. The silica/germania nanoparticles can comprise a dopant element from about $1.0 \times 10^{-7}$ to about 15 atomic percent relative to the silicon atoms of the silica/germania nanoparticles.

In another aspect, the invention relates to a method for forming a dispersion in which the method comprises blending a collection of doped silica/germania nanoparticles with a liquid and the liquid and nanoparticles are selected to be compatible with each other. The nanoparticles have an average primary particle size from about 1 nm to about 100 nm and a volume-average secondary particle size no more than about 500 nm following mixing. In some embodiments, the silica/germania nanoparticles comprise a dopant element from about $1.0 \times 10^{-7}$ to about 15 atomic percent relative to the silicon/germanium atoms of the silica/germania nanoparticles.

In other aspects, the invention relates to a method for forming a deposit of silica/germania particles on a substrate surface in which the method comprises inkjet printing a pattern of an ink. The ink generally comprises silica/germania particles having an average primary particle size from about 1 nm to about 100 nm and a volume-average secondary particle size no more than about 500 nm.

Moreover, the invention pertains to a method for doping a semiconductor substrate comprising silicon or germanium in which the method comprises heating a deposit in contact with substrate to drive dopant into the substrate. The deposit generally comprises doped silica/germania particles in which the doped silica/germania particles comprise a dopant element from about $1.0 \times 10^{-7}$ to about 15 atomic percent relative to the silicon/germanium atoms of the silica/germania particles. The particles can have an average primary particle size from about 1 nm to about 100 nm and an average second particle size no more than about 500 nm based on a dispersion formed with the particles prior to forming a coating.

DETAILED DESCRIPTION OF THE INVENTION

Figure 1:
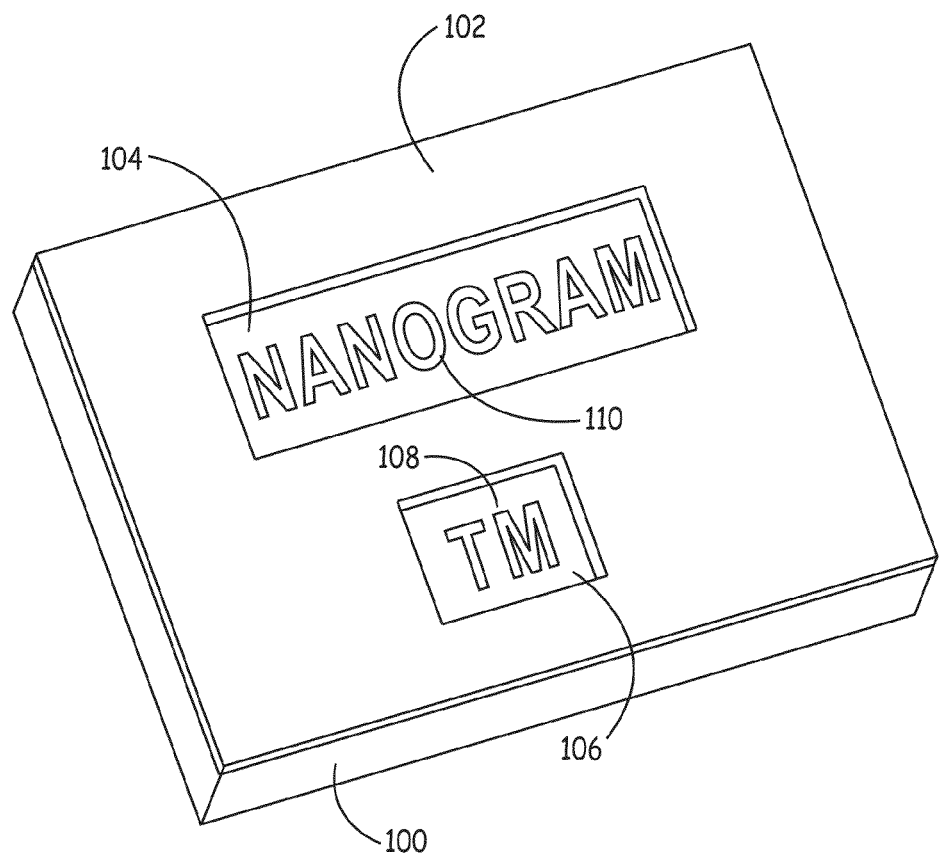
FIG. 1 is a top perspective view of a printed substrate.

Versatile processes for the delivery of silica and/or germania nanoparticles can be based upon the ability to form high quality dispersions of silica nanoparticles along with the ability to produce silica nanoparticles with desirable properties. In some embodiments, the silica particles have selected dopants, which can provide dopant elements for appropriate applications. As described herein, the dispersions of the silica particles generally have highly uniform silica particles that can be dispersed well such that the resulting dispersions have a small secondary particle size with high uniformity. Since the dispersions can be formed with appropriate properties, the dispersions can be used to formulate inks suitable for inkjet printing, which provides for efficient and precise deposition of the inks. In embodiments relating to doped silica particles, the dispersions and inks can be used to place deposits of doped silica at selected locations along a semiconductor substrate. The dopants from the silica particles can be driven into the semiconductor materials to correspondingly dope the semiconductors at the selected locations. In some embodiments, the doped particles comprise Si, Ge, $SiO_2$, $GeO_2$, combinations thereof or mixtures thereof.

Silica, i.e., silicon dioxide or $SiO_2$, is an important material for a range of applications. For example, silica can be used to form transparent optical materials useful for the transmission of light. In addition, silica is a useful dielectric for applications in electronics. Silica can be used as a dielectric with silicon based semiconductors since silica particles can be produced such that the material does not provide any contaminants that can negatively impact the performance of a silicon based semiconductor if the contaminants migrate into the silicon based semiconductor. Also, silica can be selectively doped to influence the properties of the silica. As described further below, the doped silica particles can be used to deliver dopants to a silicon based semiconductor without providing undesirable contaminants. Germania can be used similarly with respect to germanium-based semiconductors as silica is used for silicon-based semiconductors. For some applications, mixtures or blends of silica and germania may be useful. To simplify the discussion in the detailed description of the invention, the term silica is used to refer to silica, germania, combinations, e.g., alloys, thereof and mixtures thereof, unless otherwise stated or otherwise clearly limited in the context, such as with respect to the description of chemical precursors. With respect to the claims, silica shall refer only to silica, and silica/germania shall refer to silica, germania, combinations/alloys thereof and mixtures thereof.

Dispersions of particular interest comprise a dispersing liquid and silica particles dispersed within the liquid along with optional additives. The dispersion can be stable with respect to avoidance of settling over a reasonable period of time, generally at least an hour, without further mixing. A dispersion can be used as an ink, i.e., the dispersion can be printed. The properties of the ink can be adjusted based on the particular printing method. For example, in some embodiments, the viscosity of the ink is adjusted for the particular use, such as ink jet printing, and particle concentrations and additives provide some parameters to adjust the viscosity. The availability to form stable dispersions with small secondary particle sizes provides the ability to form certain inks, such as inkjet inks, that could not have been reasonably formed previously without the ability to form stable dispersions with desired properties. Other additives can be used to formulate a range of inks with appropriate properties.

The ability to form good dispersion is related to the ability to synthesize silica particles with appropriate particle properties relating to the particle size, uniformity and surface chemistry. Flow based synthesis methods have been discovered to be very versatile with respect to synthesizing desired silica particles. In flow based methods, such as laser pyrolysis and flame pyrolysis, the product particles are collected as a powder. Since the powder needs to be dispersed to place the particles into a liquid, there are inherent disadvantages with respect to solution based approaches. However, these disadvantages are compensated by the ability to manipulate the particles during the flow-based synthesis to achieve desired particle properties. For example, the flow-based approaches are particularly versatile with respect to forming doped silica particles.

Furthermore, it is desirable for the silica particles to be uniform with respect to particle size and other properties. Specifically, it is desirable for the particles to have a uniform primary particle size and for the primary particles to be substantially unfused. Then, the particles generally can be dispersed to yield a smaller more uniform secondary particle size in the dispersion. Secondary particle size refers to measurements of particle size within a dispersion. The formation of a good dispersion with a small secondary particle size can be facilitated through the matching of the surface chemistry of the particles with the properties of the dispersing liquid. As described below, the surface chemistry of particles can be influenced during synthesis of the particles as well as following collection of the particles. For example, the formation of dispersions with polar solvents is facilitated if the particles have polar groups on the particle surface.

In general, desirable silica particles for dispersions and corresponding inks are submicron. In other words, the particle collections have an average primary particle diameter of no more than about 1 micron, which is equal to 1000 nanometers (nm), and in some embodiments the average primary particle diameter is no more than about 100 nm. In some embodiments, the particles are very uniform in particle size. Also, the particle can have appropriate surface properties to form good dispersions for inks and other uses. Suitable submicron particles can be formed, for example, by vapor-based flow processes, such as flame pyrolysis or laser pyrolysis, or solution-based approaches, such as sol gel approaches. Laser pyrolysis is a desirable approach for the formation of the particles since the resulting particle are generally highly uniform and can be well dispersed using techniques that have been developed for dispersing inorganic oxide particles, as described further below. In addition, laser pyrolysis is also desirable due to its flexibility with respect to product particle composition, such as a wide range of ability to introduce dopants.

As described herein, improved approaches have been found to disperse dry nanoparticle powders, perform surface modification of the particles in a dispersion and form inks and the like for deposition. Using one or more of the improved processing approaches described herein, inks can be formed that can be deposited using inkjet printing and other convenient printing approaches. Thus, the advantages of vapor-based particle synthesis can be combined with desirable solution based processing approaches with highly dispersed particles to obtain improved dispersions and inks with properties that were previously unachievable.

In some embodiments of particular interest, the particles are synthesized by laser pyrolysis in which light from an intense light source drives the reaction to form the particles. Laser pyrolysis is useful in the formation of particles that are highly uniform in composition and size. The ability to introduce a range of precursor compositions facilitates the formation of silica particles with selected dopants, which can be introduced at relatively high concentrations.

Laser pyrolysis has been successfully used for the synthesis of a wide range of complex inorganic particles, including, for example, compositions with multiple metal/metalloid elements as well as doped materials. For example, the synthesis of highly uniform silica particles is described in U.S. Pat. No. 6,471,930 to Kambe et al., entitled "Silicon Oxide Particles," and U.S. Pat. No. 6,726,990 to Kumar et al., entitled "Silicon Oxide Particles," both of which are incorporated herein by reference. A wide range of dopants for introduction into silica particles is described, for example, in U.S. Pat. No. 6,849,334 to Home et al., entitled "Optical Materials and Optical Devices," incorporated herein by reference.

In the laser pyrolysis process, the dopant element(s) are introduced into the reactant stream such that the elements can be incorporated into the product particles. The dopant elements can be delivered into the reactant stream as a suitable composition. The reactant stream can comprise vapor precursor and/or aerosol precursors. For the doping of semiconductor substrates, desirable dopants include, for example, B, P, Al, Ga, As, Sb and combinations thereof.

With respect to silica dispersions, the dispersions can have concentrations from low concentrations to about 30 weight percent. In general, the secondary particles size can be expressed as a cumulant mean, or Z-average particle size as measured with dynamic light scattering (DLS). The Z-average particle size is an intensity average based on the scattered light measurements, and the scattering intensity based particle size distribution can be converted to volume distributions that can be used to evaluate a volume-average size. Generally, the volume-average particle size is no more than about 2 microns and in some embodiments, no more than about 250 nm. Additionally, in some embodiments it is desirable for the secondary particle size distribution to be narrow.

In general, the surface chemistry of the particles influences the process of forming the dispersion. In particular, it is easier to disperse the particles to form smaller secondary particle sizes if the dispersing liquid and the particle surfaces are compatible chemically. In some embodiments, the liquid may be selected for to be appropriate for the particular use of the dispersion, such as for a printing process. The surface properties of the particles can be correspondingly be adjusted for the dispersion.

In general, the surface chemistry of the particles can be influenced by the synthesis approach. The surface by its nature represents a termination of the underlying solid state structure of the particle. This termination of the surface of the silica particles can involve the formation of single bonds, such as Si—O—H, or strained bonds, such as Si—O—Si that introduce surface strain along the surface. The termination of particular particles influences the surface chemistry of the particles. The nature of the reactants, reaction conditions, and by-products during particle synthesis influences the surface chemistry of the particles collected as a powder during flow reactions.

The stability of particle dispersions can be improved at higher concentrations of particles through surface modification of the particles. In general, the surface properties of the particles influence the dispersion of the particles. The surface properties of the particles generally depend on the synthesis approach as well as the post synthesis processing. Some surface active agents, such as many surfactants, act through non-bonding interactions with the particle surfaces. In some embodiments, desirable properties are obtained through the use of surface modification agents that chemically bond to the particle surface. Suitable surface modification agents include, for example, alkoxysilanes, which chemically bond to metal oxide and metalloid oxide particles. For silica particles, the alkoxysilanes bond through an O—Si bond. In particular, trialkoxysilanes can form three bonds with the particle surface, which stabilizes the bonds with the particle. The fourth side group of the trialkoxysilane that does not bond with the particle surface influences the resulting properties of the surface modified particles that relate with the interaction with fluids.

When processing a dry, as-synthesized powder, it has been found that forming a good dispersion of the particle prior to surface modification involving chemical bonding facilitates the surface modification process and results in particles with a higher degree of surface modification. The dispersion of the as-synthesized particles generally comprises the selection of a solvent that is relatively compatible with the particles based on the surface chemistry of the particles. Shear, sonication or other appropriate mixing conditions can be applied to facilitate the formation of the dispersion. In general, it is desirable for the particles to be well dispersed, although the particles do not need to be stably dispersed if the particles are subsequently surface modified with a chemically bonded composition.

If the particles are dispersed prior to performing the surface modification, the surface modification agent can be added to the dispersion in a solvent that is soluble or miscible with dispersing liquid of the particle dispersion. Appropriate mixing can be applied to combine the surface modifying composition with the dispersed particles. The surface modifying compound can chemically bond with the dispersed particles to form a dispersion of surface modified particles.

The silica inks can be deposited onto the substrate using any suitable process, such as a selected coating process, for example, spray coating, and/or printing. While various printing approaches can be effective, inkjet printing is desirable in some embodiments due to resolution and speed that can be achieved. Suitable inkjet heads are available commercially or can be constructed in simple forms using basic technology, although new designs can be used that are more suitable for a particular application.

Printing processes can effectively coat large areas very quickly and efficiently. For semiconductor applications, the use of the printing techniques described herein can eliminate one or more photolithography steps. For semiconductor doping, the substrate can comprise silicon, germanium or alloy thereof. A printing process can deposit the ink at specific locations along the substrate surface. This allows the selective doping of the substrate. Similarly, for other applications such as optical applications, the printing at selected locations can be useful for forming an optical structure with patterned optical material, which can be useful for making displays or the like. Other patterning approaches can be used alone or combined with a printing approach, or no patterning can be used, as appropriate for a specific application.

For semiconductor doping applications, once a doped silica ink is deposited at selected locations, the dopant can be driven into the substrate to dope the surface layer of the substrate. This can be done by heating the substrate in an oven to relatively high temperatures, such as 750° C. to 1100° C. to obtain the desired diffusion profile for the dopant. Nanoparticles melt or flow at lower temperatures than larger particles so that the use of nanoparticles can facilitate the doping process with oven based heating. A faster process involves rapid thermal anneal in which higher temperatures of 1000° C. to 1250° C. are reached for short times, such as from about 20 seconds to about 120 seconds. These temperatures are still below the melting point of silicon, so that rapid thermal annealing is still a solid state diffusion process. However, improved control of the resulting doped substrate as well as energy saving can be obtained through the application of light energy, such as from a UV light source, using a laser or incoherent light source, to melt just the surface of the substrate without generally heating the substrate or only heating the substrate to lower temperatures. After the dopant is driven into the substrate surface, the residual oxide material can be etched off of the substrate, such as using wet etching or plasma etching.

In general, the doping approaches described herein can be applied to any appropriate semiconductor processing applications. Thus, the dopant approaches described herein can be used in the formation of integrated circuits and other electrical and electro-optical devices, such as microelectromechanical (MEMS) devices. In particular, these processing approaches can be effectively used in the formation of photovoltaic devices, i.e., solar cells. The processes herein are well suited for large area semiconductors such as photovoltaic panels as well as other large area applications, such as optical applications. Similarly, through the printing process the doped silica can be used to deliver dopants to corresponding select locations on the semiconductor surface so that printed electronics can be formed. Printed electronics can be an effective approach for the formation of semiconductor devices with moderate resolution of electrical components at a lower cost than photolithography.

For solar cell applications, the use of doped silica particles to dope corresponding sections of silicon semiconductors has been known for some time. Screen printing of doped silica sol-gel solution to dope a semiconductor for a solar cell is described in U.S. Pat. No. 4,104,091 to Evans, Jr. et al., entitled "Application of Semiconductor Diffusants to Solar Cells by Screen Printing," incorporated herein by reference. Once the silica is printed to place the silica at desired locations, the printed structure is heated to drive the dopants form the silica into the adjacent semiconductor.

The formation of desirable solar cell elements on a thin silicon foil is described further in copending U.S. Provisional patent application 60/902,006 to Hieslmair et al. filed Feb. 16, 2007, entitled "Photovoltaic Cell Structures, Solar Panels and Corresponding Structures," incorporated herein by reference. This provisional application describes the desirability in some embodiments of forming shallow doped regions. These shallow doped regions can be conveniently formed by printing the doped silica and using laser light to drive in the dopants, as described further below. Although in other embodiments, thicker junctions may be desired.

Optical applications of particular interest include, for example, displays in which display elements can be formed through the printing process and subsequent processing to form the display element. For example, phosphor particles can be coated with silica to stabilize the phosphor properties. The resulting silica coated particles can be dispersed as described herein to deposit the phosphor particles. The deposited phosphor particles can be heated to fuse the particles into a mass that forms a display element. Boron, phosphorous and/or germanium dopants can be used to lower the flow temperature of the silica particles. Also, rare earth dopants can be added into phosphors to form active materials that can emit light under appropriate activating conditions. Thus, the printing process can be effective to form display structures with desired optical material at selected locations within the structure in which the optical materials incorporate particular dopants to influence the optical and/or physical properties of the material.

In other applications, the particles can be deposited to form waveguides and the like, which can be useful for optical communications applications. The silica dopants can be selected to adjust the index-of-refraction of the particles. The index-of-refraction of the resulting optical structure following fusing of the particles can be altered through the adjustment of the index-of-refraction of the particles. The index-of-refraction of the waveguides is selected to provide for total internal reflection of selected wavelengths of light. The waveguide can be printed to follow a selected optical pathway.

As described herein, high quality dispersions of silica, with or without dopants, provides the ability for effective printing of the silica to form higher resolution structures. Due to the enhanced ability to control the properties of the inks, the silica can be printed rapidly and with relatively high resolution, for example, using inkjet printing or other desired approach. The ability to introduce selected dopants over a wide range of compositions provides the ability to form a corresponding wide range of devices based on the silica particles. The dopants can be driven into an underlying semiconductor substrate or incorporated into a silica structure for optical or other applications.

Particle Synthesis and Properties

The improved dispersions/inks described herein are based in part on the ability to form highly uniform silica nanoparticles. Laser pyrolysis is a particularly suitable approach for the synthesis of highly uniform silica particles. Also, laser pyrolysis is a versatile approach for the introduction of desired dopants at a selected concentration. Also, the surface properties of the silica particles can be influences by the laser pyrolysis process, although the surface properties can be further manipulated after synthesis to form desired dispersions. Small and uniform silica particles can provide processing advantages with respect to forming dispersions/inks.

In some embodiments, the particles have an average diameter of no more than about one micron, and in further embodiments it is desirable to have particles with smaller particle sizes to introduce desired properties. For example, nanoparticles with a small enough average particle size are observed to melt at lower temperatures than bulk material, which can be advantageous in some contexts. Also, the small particle sizes provide for the formation of inks with desirable properties, which can be particularly advantageous for inkjet printing since larger particles may clog some inkjet heads. In the formation of optical material, for example, the optical properties, such as index-of-refraction and/or emission, of the silica particles can be selected through the addition of dopants. With respect to transparency, the particle size and uniformity of the particles influences the corresponding properties of the particles when delivered appropriately such as in a polymer composite.

Suitable submicron and nano-scale particles can be formed, for example, by laser pyrolysis, flame synthesis, combustion, or solution-based processes, such as sol gel approaches. While laser pyrolysis is a desirable approach for particle production, submicron particles can be produced using a flame production apparatus such as the apparatus described in U.S. Pat. No. 5,447,708 to Helble et al., entitled "Apparatus for Producing Nanoscale Ceramic Particles," incorporated herein by reference. Furthermore, submicron particles can be produced with a thermal reaction chamber such as the apparatus described in U.S. Pat. No. 4,842,832 to Inoue et al., "Ultrafine Spherical Particles of Metal Oxide and a Method for the Production Thereof," incorporated herein by reference.

In particular, laser pyrolysis is useful in the formation of particles that are highly uniform in composition, crystallinity, when appropriate, and size. Laser pyrolysis involves light from an intense light source that drives the reaction to form the particles. Due to the versatility of laser pyrolysis as an excellent approach for efficiently producing a wide range of nanoscale particles with a selected composition and a narrow distribution of average particle diameters, laser pyrolysis can be used to form doped silica particles with a wide range of selected dopants or combinations of dopants. For convenience, light-based pyrolysis is referred to as laser pyrolysis since this terminology reflects the convenience of lasers as a radiation source and is a conventional term in the art. Laser pyrolysis approaches discussed herein incorporate a reactant flow that can involve gases, vapors, aerosols or combinations thereof to introduce desired elements into the flow stream. The versatility of generating a reactant stream with gases, vapor and/or aerosol precursors provides for the generation of particles with a wide range of potential compositions.

A collection of submicron/nanoscale particles may have an average diameter for the primary particles of less than about 500 nm, in some embodiments from about 2 nm to about 100 nm, alternatively from about 2 nm to about 75 nm, or from about 2 nm to about 50 nm. A person of ordinary skill in the art will recognize that other ranges within these specific ranges are covered by the disclosure herein. Primary particle diameters are evaluated by transmission electron microscopy.

As used herein, the term "particles" refer to physical particles, which are unfused, so that any fused primary particles are considered as an aggregate, i.e. a physical particle. For particles formed by laser pyrolysis, the particles can be generally effectively the same as the primary particles, i.e., the primary structural element within the material. Thus, the ranges of average primary particle sizes above can also be used with respect to the particle sizes. If there is hard fusing of some primary particles, these hard fused primary particles form correspondingly larger physical particles. The primary particles can have a roughly spherical gross appearance, or they can have rod shapes, plate shapes or other non-spherical shapes. Upon closer examination, crystalline particles may have facets corresponding to the underlying crystal lattice. Amorphous particles generally have a spherical aspect. Diameter measurements on particles with asymmetries are based on an average of length measurements along the principle axes of the particle.

Because of their small size, the particles tend to form loose agglomerates due to van der Waals and other electromagnetic forces between nearby particles. Even though the particles may form loose agglomerates, the nanometer scale of the particles is clearly observable in transmission electron micrographs of the particles. The particles generally have a surface area corresponding to particles on a nanometer scale as observed in the micrographs. Furthermore, the particles can manifest unique properties due to their small size and large surface area per weight of material. For example, the absorption spectrum of crystalline, nanoscale $TiO_2$ particles is shifted into the ultraviolet. These loose agglomerates can be dispersed in a liquid to a significant degree, and in some embodiments approximately completely to form dispersed primary particles.

The particles can have a high degree of uniformity in size. Laser pyrolysis generally results in particles having a very narrow range of particle diameters. Furthermore, heat processing under suitably mild conditions generally does not significantly alter the very narrow range of particle diameters. With aerosol delivery of reactants for laser pyrolysis, the distribution of particle diameters is particularly sensitive to the reaction conditions. Nevertheless, if the reaction conditions are properly controlled, a very narrow distribution of particle diameters can be obtained with an aerosol delivery system. As determined from examination of transmission electron micrographs, the particles generally have a distribution in sizes such that at least about 95 percent, and in some embodiments 99 percent, of the particles have a diameter greater than about 35 percent of the average diameter and less than about 280 percent of the average diameter. In additional embodiments, the particles generally have a distribution in sizes such that at least about 95 percent, and in some embodiments 99 percent, of the particles have a diameter greater than about 40 percent of the average diameter and less than about 250 percent of the average diameter. In further embodiments, the particles have a distribution of diameters such that at least about 95 percent, and in some embodiments 99 percent, of the particles have a diameter greater than about 60 percent of the average diameter and less than about 200 percent of the average diameter. A person of ordinary skill in the art will recognize that other ranges of uniformity within these specific ranges are contemplated and are within the present disclosure.

Furthermore, in some embodiments essentially no particles have an average diameter greater than about 5 times the average diameter, in other embodiments about 4-times the average diameter, in further embodiments 3 times the average diameter, and in additional embodiments 2 times the average diameter. In other words, the particle size distribution effectively does not have a tail indicative of a small number of particles with significantly larger sizes. This is a result of the small reaction region to form the inorganic particles and corresponding rapid quench of the inorganic particles. An effective cut off in the tail of the size distribution indicates that there are less than about 1 particle in $10^6$ has a diameter greater than a specified cut off value above the average diameter. High particle uniformity can be exploited in a variety of applications.

In addition, the submicron particles may have a very high purity level. Furthermore, crystalline nanoparticles, such as those produced by laser pyrolysis, can have a high degree of crystallinity. Similarly, the crystalline nanoparticles produced by laser pyrolysis can be subsequently heat processed to improve and/or modify the degree of crystallinity and/or the particular crystal structure. Impurities on the surface of the particles may be removed by heating the particles to achieve not only high crystalline purity but high purity overall.

The size of the dispersed particles can be referred to as the secondary particle size. The primary particle size, of course, is the lower limit of the secondary particle size for a particular collection of particles, so that the average secondary particle size can be approximately the average primary particle size if the primary particles are substantially unfused and if the particles are effectively completely dispersed in the liquid.

The secondary or agglomerated particle size may depend on the subsequent processing of the particles following their initial formation and the composition and structure of the particles. In particular, the particle surface chemistry, properties of the dispersant, the application of disruptive forces, such as shear or sonic forces, and the like can influence the efficiency of fully dispersing the particles. Ranges of values of average secondary particle sizes are presented below with respect to the description of dispersions. Secondary particles sizes within a liquid dispersion can be measured by established approaches, such as dynamic light scattering. Suitable particle size analyzers include, for example, a Microtrac UPA instrument from Honeywell based on dynamic light scattering, a Horiba Particle Size Analyzer from Horiba, Japan and ZetaSizer Series of instruments from Malvern based on Photon Correlation Spectroscopy. The principles of dynamic light scattering for particle size measurements in liquids are well established.

A basic feature of successful application of laser pyrolysis for the production of desirable silica particles is the generation of a reactant stream containing one or more silicon precursor compounds and, in some embodiments, a radiation absorber and/or a secondary reactant. The secondary reactant can be a source of oxygen atoms for the silica product particles and/or can be an oxidizing or reducing agent to drive a desired product formation. A secondary reactant may not be used if the precursor decomposes to the desired product under intense light radiation. Similarly, a separate radiation absorber may not be used if the silicon precursor and/or the secondary reactant absorb the appropriate light radiation to drive the reaction. Dopant precursors can be introduced into the reactant flow for incorporation into the silica particles.

The reaction of the reactant stream is driven by an intense radiation beam, such as a light beam, e.g., a laser beam. In some embodiments, $CO_2$ lasers can be effectively used. As the reactant stream leaves the radiation beam, the inorganic particles are rapidly quenched with particles in present in the resulting product particle stream, which is a continuation of the reactant stream. The concept of a stream has its conventional meaning of a flow originating from one location and ending at another location with movement of mass between the two points, as distinguished from movement in a mixing configuration. A laser pyrolysis apparatus suitable for the production of commercial quantities of particles by laser pyrolysis has been developed using a reactant inlet that is significantly elongated in a direction along the path of the laser beam. This high capacity laser pyrolysis apparatus, e.g., 1 kilogram or more per hour, is described in U.S. Pat. No. 5,958,348, entitled "Efficient Production Of Particles By Chemical Reaction," incorporated herein by reference. Approaches for the delivery of aerosol precursors for commercial production of particles by laser pyrolysis is described in copending and commonly assigned U.S. Pat. No. 6,193,936 to Gardner et al., entitled "Reactant Delivery Apparatus," incorporated herein by reference. With respect to combined vapor and aerosol delivery approaches, a silicon precursor can be delivered as a vapor, while one or more dopant precursors are delivered as an aerosol. However, for many desirable dopants, suitable dopant precursors can be delivered as a vapor.

In general, nanoparticles produced by laser pyrolysis can be subjected to additional processing to alter the nature of the particles, such as the composition and/or the crystallinity. For example, the nanoparticles can be subjected to heat processing in a gas atmosphere prior to use. Under suitably mild conditions, heat processing is effective to modify the characteristics of the particles, such as removal of carbon contaminants, without destroying the nanoscale size or the narrow particle size distribution of the initial particles. For example, heat processing of submicron vanadium oxide particles is described in U.S. Pat. No. 5,989,514 to Bi et al., entitled "Processing Of Vanadium Oxide Particles With Heat," incorporated herein by reference.

A wide range of simple and complex submicron and/or nanoscale particles have been produced by laser pyrolysis with or without additional heat processing. Specifically, the inorganic particles can include, for example, elemental metal or elemental metalloid, i.e. un-ionized elements such as silver or silicon, metal/metalloid oxides, metal/metalloid nitrides, metal/metalloid carbides, metal/metalloid sulfides or combinations thereof. In addition, uniformity of these high quality materials can be substantial. These particles generally can have a very narrow particle size distribution. Laser pyrolysis methods and uniform silica particles formed by laser pyrolysis are described further in U.S. Pat. No. 6,471,903 to Kambe et al., entitled "Silicon Oxide Particles," and U.S. Pat. No. 6,726,990 to Kumar et al., entitled "Silicon Oxide Particles," both of which are incorporated herein by reference. Doped silica particles formed using laser pyrolysis process are described in U.S. Pat. No. 6,849,334 to Home et al., entitled "Optical Materials and Optical Devices," incorporated herein by reference. The production of a range of particles by laser pyrolysis is described further in published U.S. Patent Application 2003/203205A to Bi et al., entitled "Nanoparticle Production and Corresponding Structures," incorporated herein by reference. The formation of doped Si and Ge particles is described further in copending U.S. Provisional patent application Ser. No. 60/782,115 to Hieslmair et al., entitled "Thin Silicon or Germanium Sheets and Photovoltaics Formed From Thin Sheets," incorporated herein by reference.

Submicron and nanoscale particles can be produced with selected dopants using laser pyrolysis and other flowing reactor systems. Dopants can be introduced at desired concentrations by varying the composition of the reactant stream. A dopant element or a combination of dopant elements are introduced into the silica host material by appropriately selecting the composition in the reactant stream and the processing conditions. Thus, submicron particles incorporating selected dopants, including, for example, rare earth dopants and/or complex blends of dopant compositions, can be formed. Generally, an oxygen source should also be present in the reactant stream since the dopant elements are introduced into the silica particles as an oxide of the dopant element. In other words, the conditions in the reactor should be sufficiently oxidizing to produce the oxide compositions. The doped particles can be either amorphous solid state blends with the dopant composition dissolved in the host material or the dopant can be an intercalation composition. In some embodiments, one or more dopants can be introduced in concentrations in the particles from about $1.0 \times 10^{-7}$ to about 15 atomic percent relative to the silicon atoms, in further embodiments from about $1.0 \times 10^{-5}$ to about 5.0 atomic percent and in further embodiments from about $1 \times 10^{-4}$ to about 1.0 atomic percent relative to the silicon atoms. A person of ordinary skill in the art will recognize that additional ranges within the explicit dopant level ranges are contemplated and are within the present disclosure.

Dopants can be introduced to vary properties of the resulting particles. For example, dopants can be introduced to change the optical properties of the particles, such as the index-of-refraction, or dopants can introduce fluorescent or phosphorescent properties to the particles such that they can function as phosphors. Dopants can also be introduced to alter the processing properties of the material, such as by lowering the softening temperature. Furthermore, dopants can also interact within the materials. For example, some dopants are introduced to increase the solubility of other dopants. Also, as described below, the dopants can be used to transfer dopants to an adjacent material, such as a semiconductor substrate.

In some embodiments, the one or plurality of dopants are rare earth metals or rare earth metals with one or more other dopant elements. Rare earth metals comprise the transition metals of the group Mb of the periodic table. Specifically, the rare earth elements comprise Sc, Y and the Lanthanide series. Other suitable dopants comprise elements of the actinide series. For optical glasses, the rare earth metals of particular interest as dopants comprise, for example, Ho, Eu, Ce, Tb, Dy, Er, Yb, Nd, La, Y, Pr and Tm. Generally, the rare earth ions of interest have a +3 ionization state, although $Eu^{+2}$ and $Ce^{+4}$ are also of interest. Rare earth dopants can influence the optical absorption properties that can enable the application of the materials for the production of optical amplifiers and other optical devices. Suitable non-rare earth dopants for various purposes include, for example, Bi, Sb, Zr, Pb, Li, Na, K, Ba, B, Si, Ge, W, Ca, Cr, Ga, Al, Mg, Sr, Zn, Ti, Ta, Nb, Mo, Th, Cd and Sn.

In addition, dopants can be introduced to change the electrical properties of the particles. In particular, As, Sb and/or P dopants can be introduced into the silicon particles to form n-type semiconducting materials in which the dopant provide excess electrons to populate the conduction bands, and B, Al, Ga and/or In can be introduced to form p-type semiconducting materials in which the dopants supply holes. In general, any reasonable element can be introduced as a dopant to achieve desired properties.

Suitable silicon precursors for elemental silicon particle formation include, for example, silane ($SiH_4$), disilane ($Si_2H_6$), trisilane ($Si_3H_8$), silicon tetrachloride ($SiCl_4$), trichlorosilane ($SiCl_3H$), and $SiCl_2H_2$. Silane, $SiH_4$, is a convenient precursor for laser pyrolysis since it absorbs infrared light from a $CO_2$ laser and decomposes to form crystalline silicon particles upon decomposition. The higher order silanes similarly decompose to form elemental silicon, i.e. $Si^0$, silicon in its elemental state. Thus, with silane as a precursor, a secondary reactant source may not be used, and a separate infrared absorber is not needed. Corresponding germanes ($GeH_4$ and $Ge_2H_6$) can be used as precursors. An inert gas can be used to moderate the reaction. Suitable inert gases include for example, Ar, He $N_2$ or mixtures thereof.

Suitable precursors for B, Al, Ga, P, As, Sb and other dopants are described explicitly in the '334 patent. Suitable precursors for aerosol delivery of gallium include, for example, gallium nitrate ($Ga(NO_3)_3$). Arsenic precursors include, for example, $AsCl_3$, which is suitable for vapor delivery, and $As_2O_5$, which is suitable for aerosol precursor delivery in aqueous or alcohol solutions. Suitable boron precursors comprise, for example, diborane ($B_2H_6$), $BH_3$, and the like, and suitable combinations of any two or more thereof. Suitable aluminum precursors include, for example, aluminum hydride ($AlH_3$), aluminum s-butoxide ($Al(OC_4H_9)_3$), trimethyl aluminum ($Al(CH_3)_3$), trimethyl ammonia aluminum $Al(CH_3)_3NH_3$, and the like, and suitable combinations of any two or more thereof. Suitable phosphorous precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and suitable combinations of any two or more thereof. Suitable antimony precursors include, for example, stibine ($SbH_3$) and antimony trichloride ($SbCl_3$), which is soluble in alcohol. In some embodiments, the silicon precursor is silane ($SiH_4$), the boron percursor is diborane ($B_2H_6$), the phosphorous precursor is $PH_3$, and the oxygen source is $O_2$ or $N_2O$.

Surface Modification and Dispersion Process

The submicron silica particles generally are dispersed for further processing or use. In some embodiments, the dispersion can be further stabilized by surface modifying the silica particles. The surface modifying agents of particular interest can form chemical bonds with the particle surface. Through appropriate selection of the dispersing liquid and the particle surface properties, stable dispersions can be formed at reasonable concentrations. The dispersions can be delivered through suitable coating approaches or printed with the dispersion used as an ink.

The surface modification of inorganic particles, e.g., silica particles, can improve stability of the particle dispersions and provide for dispersion of the particles in a wider range of liquids and potentially at higher concentrations. While some surface modifiers can merely coat the surface, improved stability of the coated particles may be accomplished with surface modifiers that are chemically bonded to the surface. In particular, alkoxysilanes react with silicon oxides to form Si—O—Si bonds to form a stable surface coating with the release of a corresponding compound from the displaced alkoxy silane functional group. An improved surface coating can be achieved with improved —OH functional group coverage on the surface of the silicon oxide particles. The surface modification process can involve a switch of dispersants. For convenience of terminology, a surface modifying compound refers to a compound that adds at least 3 atoms to the particle surface when it bonds to the particle surface, to distinguish compositions, that modify the surface of a silicon oxide particle such as through the introduction of an —OH group. In general, it is expected that the presence of a dopant does not significantly alter the surface modification process or chemistry.

A range of surface modifying compounds can be used to chemically bond to the silica particle surfaces. Suitable functional groups for bonding to inorganic particles with different compositions are described in U.S. Pat. No. 6,599,631 to Kambe et al, entitled "Polymer-Inorganic Particle Composites," incorporated herein by reference. Alkoxysilanes provide stable bonding to silicon oxide particles. In particular, trialkoxysilanes provide very stable bonding to the particle surface with potentially three points of bonding. The fourth side chain of the trialkoxysilanes provides the ability to influence the dispersability and other surface properties of the surface modified inorganic particles. Specifically, the fourth side chain of the silane can be selected to improve disperability in a selected solvent and/or to provide a reactive functional group for further processing. Similarly, polydialkoxysiloxy silanes provide stable bonding with the ability of each monomer unit to form two bonds to the particle. The siloxane polymer can wrap around the particles during the bonding process. In addition to alkoxy silanes, chemical compounds with other functional groups can form bonds to silicon oxide particles. Specifically, compounds with chlorosilicate (—SiCl) groups, some amine groups, carboxylic acid groups and hydroxide groups can also bond to silicon oxide particle surfaces. Additional functional groups of these compounds can be similarly selected to yield desirable properties for the resulting surface modified particles.

With respect to the alkoxy side chains of silanes, methoxy groups and ethoxy groups have been found to be effective in reacting with inorganic oxide particle surfaces, and a range of compounds with these functional groups are commercially available. Suitable fourth functional groups for the trialkoxy silanes include, for example, alkyl groups, epoxide groups (—$(CH_2)_n$CHCH$_2$O$_{bridge}$), methacryloxyalkyl (—$(CH_2)_n$OOC=CH$_2$), isocyanate (—$(CH_2)_n$NCO), thiol (—$(CH_2)_n$SH), acetyl (—$(CH_2)_n$OOCCH$_3$), hydroxybenzophenyl (—$(CH_2)_n$OC$_6$H$_5$(OH)COC$_6$H$_5$), allyl (—CH$_2$CH=CH$_2$), and phenethyl (—$(CH_2)_n$C$_6$H$_5$). In general, the surface modifying compound can be coated at a coverage from less than a monolayer to four or more monolayers as well as values between. The amount of coverage can be estimated based on the surface area of the particles and the amount of compound that can be expected to pack along the particle surface.

One of at least two processes can be used to perform the surface modification. In one approach, an unstable, higher concentration dispersion can be formed with the silica particles, and the surface modification is performed to stabilize the higher concentration dispersion. However, better particle dispersions generally are obtained through first forming a dilute, relatively stabile dispersion of the particles without surface modification and then performing the surface modification.

In the direct approach, the liquid is selected to balance the dispersion of the unmodified particles, the solubility of the surface modifying compound unbound to the particles and the dispersion of the particles following surface modification. Generally, the liquid is not a particularly good dispersant for the unmodified particles. Similarly, the liquid may not be a good solvent for the surface modifying agent. But if the surface modifying agent is somewhat soluble in the liquid and the umodified particles can be dispersed with mixing, the surface modification reaction can be performed. As the particles become surface modified, the dispersion may stabilize as the reaction proceeds.

Better dispersion results generally can be obtained if the inorganic particles without a surface modifier are first stably dispersed with a desirably small average secondary particle size. Alcohols and water/alcohol blends generally are good dispersants for the unmodified silica particles as synthesized by some approaches. The surface modifying compound can be added directly into the alcohol or water/alcohol blend if it has some solubility, or the surface modification compound can be dissolved into a solvent that is miscible with or soluble in the liquid of the particle dispersion. After the surface modification is complete, the particles can be transferred to a different dispersing liquid as described below. The surface modified particles can be stored or shipped in a liquid suitable for further processing.

In general, to change dispersing liquids, it has been found effective to settle the particles by forming a liquid mixture in which the stability of the dispersion is lost. Centrifugation or filtration can be used to efficiently separate the particles from the liquid once they are no longer stably dispersed. If the particles are centrifuged, the liquid is decanted from the precipitated particles. The particles can be washed one or more times with a selected dispersing liquid to remove residual amounts of the original liquid. Then, the particles can be redispersed in the selected liquid. In this way, the liquid can be changed for a later processing step through the selection of a surface modifier that facilitates dispersion in the selected liquid.

Following surface modification and/or at other stages of the dispersion process, the dispersion can be filtered to remove contaminants and or any stray unusually large particles. Generally, the filter is selected to exclude particulates that are much larger than the average secondary particle size so that the filtration process can be performed in a reasonable way. In general, the filtration processes have not been suitable for overall improvement of the dispersion quality. Suitable commercial filters are available, and can be selected based on the dispersion qualities and volumes.

Properties and Formation of the Dispersions and Inks

The dispersions can be formulated for a selected application. The dispersions can be characterized with respect to composition as well as the characterization of the particles within the dispersions. In general, the term ink is used to describe a dispersion that is subsequently deposited using a printing technique, and an ink may or may not include additional additives to modify the ink properties.

The dispersions comprise a liquid and the dispersed silica particles, which may or may not be surface modified. In general, silica particles formed by laser pyrolysis can be well dispersed in water or alcohols at moderate concentrations with no surface modification, although higher concentration dispersions generally can be formed with surface modification. Suitable alcohols include, for example, small aliphatic alcohols, such as methanol, ethanol, propylene glycol, butanediol, mixtures thereof and the like. Upon surface modification, the silica particles can be dispersed in a broader range of solvents and solvent blends through the matching of the chemical properties of the surface modifying agent with the liquid. Thus, following surface modification, the particles can be well dispersed in a range of less polar solvents, such as ethyl lactate, n-methylpyrrolidinone, gamma-butyl lactone, and the like.

Better dispersions are more stable and/or have a smaller secondary particle size indicating less agglomeration. As used herein, stable dispersions have no settling without mixing after one hour. In some embodiments, the dispersions exhibit no settling of particles without mixing after one day and in further embodiments after one week, and in additional embodiments after one month. In general, dispersions with well dispersed particles can be formed at concentrations of at least up to 30 weight percent inorganic particles. Generally, for some embodiments it is desirable to have dispersions with a particle concentration of at least about 0.05 weight percent, in other embodiments at least about 0.25 weight percent, in additional embodiments from about 0.5 weight percent to about 30 weight percent and in further embodiments from about 1 weight percent to about 20 weight percent. A person of ordinary skill in the art will recognize that additional ranges of stability times and concentrations within the explicit ranges above are contemplated and are within the present disclosure.

The dispersions can include additional compositions besides the silica particles and the dispersing liquid or liquid blend to modify the properties of the dispersion to facilitate the particular application. For example, property modifiers can be added to the dispersion to facilitate the deposition process. Surfactants can be effectively added to the dispersion to influence the properties of the dispersion.

In general, cationic, anionic, zwitter-ionic and nonionic surfactants can be helpful in particular applications. In some applications, the surfactant further stabilizes the particle dispersions. For these applications, the selection of the surfactant can be influenced by the particular dispersing liquid as well as the properties of the particle surfaces. In general, surfactants are known in the art. Furthermore, the surfactants can be selected to influence the wetting or beading of the dispersion/ink onto the substrate surface following deposition of the dispersion. In some applications, it may be desirable for the dispersion to wet the surface, while in other applications it may be desirable for the dispersion to bead on the surface. The surface tension on the particular surface is influenced by the surfactant. Also, blends of surfactants can be helpful to combine the desired features of different surfactants, such as improve the dispersion stability and obtaining desired wetting properties following deposition. In some embodiments, the dispersions can have surfactant concentrations from about 0.01 to about 5 weight percent, and in further embodiments from about 0.02 to about 3 weight percent.

The use of non-ionic surfactants in printer inks is described further in U.S. Pat. No. 6,821,329 to Choy, entitled "Ink Compositions and Methods of Ink-Jet Printing on Hydrophobic Media," incorporated herein by reference. Suitable non-ionic surfactants described in this reference include, for example, organo-silicone surfactants, such as SILWET™ surfactants from Crompton Corp., polyethylene oxides, alkyl polyethylene oxides, other polyethylene oxide derivatives, some of which are sold under the trade names, TERGI- TOL™, BRIJ™, TRITON™, PLURONIC™, PLURAFAC™, IGEPALE™, and SULFYNOL™ from commercial manufacturers Union Carbide Corp., ICI Group, Rhone-Poulenc Co., Rhom & Haas Co., BASF Group and Air Products Inc. Other nonionic surfactants include MACKAM™ octylamine chloroacetic adducts from McIntyre Group and FLUORAD™ fluorosurfactants from 3M. The use of cationic surfactants and anionic surfactants for printing inks is described in U.S. Pat. No. 6,793,724 to Satoh et al., entitled "Ink for Ink-Jet Recording and Color Ink Set," incorporated herein by reference. This patent describes examples of anionic surfactants such as polyoxyethylene alkyl ether sulfate salt and polyoxyalkyl ether phosphate salt, and examples of cationic surfactants, such as quaternary ammonium salts.

Viscosity modifiers can be added to alter the viscosity of the dispersions. Suitable viscosity modifiers include, for example soluble polymers, such as polyacrylic acid, polyvinyl pyrrolidone and polyvinyl alcohol. Other potential additives include, for example, pH adjusting agents, antioxidants, UV absorbers, antiseptic agents and the like. These additional additives are generally present in amounts of no more than about 5 weight percent. A person of ordinary skill in the art will recognize that additional ranges of surfactant and additive concentrations within the explicit ranges herein are contemplated and are within the present disclosure.

For electronic applications and some optical application, it can be desirability to remove organic components to the ink prior to or during certain processing steps such that the product materials are effectively free from carbon. In general, organic liquids can be evaporated to remove them from the deposited material. However, surfactants, surface modifying agents and other property modifiers may not be removable through evaporation, although they can be removed through heating at moderate temperature in an oxygen atmosphere to combust the organic materials.

The use and removal of surfactants for forming metal oxide powders is U.S. Pat. No. 6,752,979 to Talbot et al., entitled "Production of Metal Oxide Particles with Nano-Sized Grains," incorporated herein by reference. The '979 patent teaches suitable non-ionic surfactants, cationic surfactants, anionic surfactants and zwitter-ionic surfactants. The removal of the surfactants involves heating of the surfactants to moderate temperatures, such as to 200° C. in an oxygen atmosphere to combust the surfactant. Other organic additives generally can be combusted for removal analogously with the surfactants. If the substrate surface is sensitive to oxidation during the combustion process, a reducing step can be used following the combustion to return the surface to its original state.

In general, if processed appropriately, for dispersions with well dispersed particles, the average secondary particle size can be no more than a factor of four times the average primary particle size, in further embodiments no more than about 3 times the average primary particle size and in additional embodiments no more than about 2 times the average primary particle size. In some embodiments, the volume-average particle size is no more than about 1 micron, in further embodiments no more than about 250 nm, in additional embodiments no more than about 100 nm, in other embodiments no more than about 75 nm and in some embodiments from about 5 nm to about 50 nm. With respect to the particle size distribution, in some embodiments, essentially all of the secondary particles can have a size no more than 5 times the volume-average secondary particle size, in further embodiments no more than about 4 times the volume-average particle size and in additional embodiments no more than about 3 times the volume-average particle size. Furthermore, the DLS particle size distribution by volume can have in some embodiments a full width at half-height of no more than about 50 percent of the Z average particle size. Also, the secondary particles can have a distribution in sizes such that at least about 95 percent of the particles have a diameter greater than about 40 percent of the average particle size and less than about 250 percent of the average particle size. In further embodiments, the secondary particles can have a distribution of particle sizes such that at least about 95 percent of the particles have a particle size greater than about 60 percent of the average particle size and less than about 200 percent of the average particle size. A person of ordinary skill in the art will recognize that additional ranges of particle sizes and distributions within the explicit ranges above are contemplated and are within the present disclosure.

Z-average particle sizes can be measured using dynamic light scattering. The Z-average particle size is based on a scattering intensity weighted distribution as a function of particle size. Evaluation of this distribution is prescribed in ISO International Standard 13321, Methods for Determination of Particle Size Distribution Part 8: Photon Correlation Spectroscopy, 1996. The Z-average distributions are based on a single exponential fit to time correlation functions. However, small particles scatter light with less intensity relative to their volume contribution to the dispersion. The intensity weighted distribution can be converted to a volume-weighted distribution that is perhaps more conceptually relevant for evaluating the properties of a dispersion. For nanoscale particles, the volume-based distribution can be evaluated from the intensity distribution using Mie Theory. The volume-average particle size can be evaluated from the volume-based particle size distribution. Further description of the manipulation of the secondary particle size distributions can be found in Malvern Instruments—DLS Technical Note MRK656-01, incorporated herein by reference.

The viscosity of the dispersion/ink is dependent on the silica particle concentration as well as the other additives. Thus, there are several parameters that provide for adjustment of the viscosity. The viscosity is particularly relevant for inkjet printing although other printing and coating processes may have desired viscosity ranges. For some embodiments, the viscosity can be from 0.1 mPa·s to about 100 mPa·s and in further embodiments from about 0.5 mPa·s to about 25 mPa·s. For some embodiments, the dispersions/inks can have a surface tension from about 2.0 to about 6.0 $N/m^2$ and in further embodiments from about 2.2 to about 5.0 $N/m^2$ and in additional embodiments form about 2.5 to about 4.5 $N/m^2$. A person of ordinary skill in the art will recognize that additional ranges of viscosity and surface tension within the explicit ranges above are contemplated and are within the present disclosure.

The dispersions/inks can be formed using the application of appropriate mixing conditions. For example, mixers/blenders that apply shear can be used and/or sonication can be used to mix the dispersions. The particular additives can be added in an appropriate order to maintain the stability of the particle dispersion. In general, appropriately selected surfactants and some property modifiers can stabilize the particle dispersion. A person of ordinary skill in the art can select the additives and mixing conditions empirically based on the teachings herein.

Printing and Other Deposition Approaches

The dispersions/inks can be deposited for using a selected approach that achieves a desired distribution of the dispersion on a substrate. For example, coating and printing techniques can be used to apply the ink to a surface. Using selected printing approaches, patterns can be formed with high resolution. Following deposition, the deposited material can be further processed into a desired device or state.

Suitable coating approaches for the application of the dispersions include, for example, spin coatings, dip coating, spray coating, knife-edge coating, extrusion or the like. Coating approaches generally are used to cover a substrate, although a mask or the like can be used to limit the deposition locations following removal of the mask. In general, any suitable coating thickness can be applied, although in embodiments of particular interest, coating thickness can range from about 50 nm to about 500 microns and in further embodiments from about 100 nm to about 250 microns. A person of ordinary skill in the art will recognize that additional ranges of thicknesses within the particular ranges above are contemplated and are within the present disclosure.

Similarly, a range of printing techniques can be used to print the dispersion/ink into a pattern on a substrate. Suitable printing techniques include, for example, screen printing, inkjet printing, lithographic printing, gravure printing and the like. Suitable substrates include, for example, polymers, such as polysiloxanes, polyamides, polyimides, polyethylenes, polycarbonates, polyesters, combinations thereof, and the like, ceramic substrates, such as silica glass, and semiconductor substrates, such as silicon or germanium substrates. The composition of the substrates influences the appropriate range of processing options following deposition of the dispersion/ink.

While various coating and printing approaches are suitable, inkjet printing offers desirable features with respect to speed, resolution and versatility with respect to real time selection of deposition patterning while maintaining speed and resolution. However, practical deposition using inkjet printing with inorganic particles requires dispersion properties that have not been available prior to development of both the techniques to form high quality silica nanoparticle along with the improved ability to form high quality dispersions from these particles. Thus, the particles produced using laser pyrolysis combined with the improved surface modification approaches and dispersion techniques provides for the formation of inks that are amenable to inkjet deposition.

In general, following deposition, the liquid evaporates to leave the particles and any other non-volatile components of the inks remaining. If the substrate tolerates suitable temperatures and if the additives have been properly selected, the additives can be removed through the addition of heat in an appropriate oxygen atmosphere to remove the additives, as described above. Similarly, with suitable substrates, the silica particles can then be melted to form a cohesive mass of the silica deposited at the selected locations. If the heat treatment is performed with reasonable control over the conditions, the deposited mass does not migrate significantly from the deposition location, and the fused mass can be further processed into a desired device.

Solar Cell and Other Semiconductor Applications

For solar cell and other semiconductor applications, silica particles can be used to form dielectric components and/or deliver dopants to semiconductor substrates, such as silicon and/or germanium materials. A representative printed substrate is shown in FIG. 1. In this embodiment, substrate 100 has a surface coating 102 with windows 104, 106 through coating 102 to expose a portion of the substrate surface. Silica ink is printed to form deposits 108, 110 on the substrate surface. The substrate comprises silicon, germanium or an alloy thereof. Suitable substrates include, for example, high purity silicon wafers and the like. In other embodiments, suitable substrates include silicon/germanium foils, as described in copending U.S. patent application Ser. No. 11/717,605 filed on Mar. 13, 2007 to Hieslmair et al., entitled "Thin Silicon or Germanium Sheets and Photovoltaics Formed From Thin Sheets," incorporated herein by reference. A silica dispersion/ink can be applied over the surface using the coating or printing techniques described above.

Some specific embodiments of photovoltaic cells using thin semiconductor foils and back surface contact processing is described further in U.S. Provisional patent application Ser. No. 60/902,006 filed on Feb. 16, 2007 to Hieslmair, entitled "Photovoltaic Cell Structures, Solar Panels, and Corresponding Processes," incorporated herein by reference. In some embodiments, the silica ink is applied through pre-established windows to the substrate surface. The doped ink is printed within the substrate windows. Other patterning or no patterning can be used as desired for a particular application.

To deliver dopant into the semiconductor from the silica deposit, the material is heated. For example, the structure can be placed into an oven or the like with the temperature set to soften the particles such that the dopants can diffuse into the substrate. The time and temperature can be adjusted to yield a desired dopant migration into the substrate. Alternative approaches can be used to heat the surface of the substrate with the deposit. A rapid thermal anneal for the general drive in of a dopant into a semiconductor material is described further in U.S. Pat. No. 6,287,925 to Yu, entitled "Formation of Highly Conductive Junctions by Rapid Thermal Anneal and Laser Thermal Process," incorporated herein by reference. The material can be heated to a temperature of under 1000° C. for an appropriate period of time to allow for dopant migration.

However, improved control of the resulting doped substrate as well as energy saving can be obtained through the use of UV light to melt just the surface of the substrate without generally heating the substrate or only heating the substrate to lower temperatures. Local high temperatures on the order of 1400° C. can be reached to melt the surface layer of the substrate as well as the oxide particles on the substrate. Generally, any intense UV source can be used, although excimer lasers or other lasers are a convenient UV source for this purpose. Eximer lasers can be pulsed at 10 to 300 nanoseconds at high fluence to briefly melt a thin layer, such as 20 nm to 1000 nm, of the substrate. Longer wavelength light sources such as 1 micron wavelength light sources can also be used.

Following the drive in of the dopant, it may or may not be desirable to remove the silica. For photovoltaic applications it is generally desirable to remove the silica to expose the doped semiconductor for the application of conductive electrical contacts. To remove the silica, the oxide can be etched, for example, using conventional approaches, such as using wet (chemical) etching or plasma etching. Suitable chemical etching compositions include, for example, tetramethyl ammonium hydroxide solution, or HF. Once the oxide is removed, the substrate can be further processed.

These same heating approaches can be used to process the silica particles into a solid dielectric mass. The particles may or may not be doped for these embodiments.

Optical Applications

For optical applications, generally the deposited silica is melted or sintered to form a solid mass from the particles to reduce scattering at the particle surfaces. Dopants can be introduced to alter the processing properties, such as the softening temperature for the particles, or the optical properties, such as the index-of-refraction or optical emission properties. The approaches described above for semiconductor processing can be adapted for optical applications. In general, for optical applications, the silica inks can be deposited to form particular optical structures, such as display elements or waveguides.

For example, in some embodiments, the inks can be printed at particular locations along a structure for the formation of a display. Then, the deposits can be cured at the printed locations. The dopants can be varied to alter the optical properties at different locations along the display. In some embodiments, the particles can comprise phosphor materials coated with silica. The coating of phosphor particles with silica is described further in U.S. Pat. No. 5,908,698 to Budd, entitled "Encapsulated Electroluminescent Phosphor and Method for Making Same," and in U.S. Pat. No. 5,599,529 to Cowie, entitled "Dispersions," both of which are incorporated herein by reference. The coated particles can be dispersed and deposited according to the description of other silica particles described herein. The core phosphor particles can be formed, for example, as described in U.S. Pat. No. 6,692,660 to Kumar, entitled "High Luminescent Phosphor Particles and Related Particle Compositions," incorporated herein by reference. Different phosphor materials can be deposited at different locations to form a desired display device. While many display structures are known or can be subsequently developed in the art, and example of a display structure is found in U.S. Pat. No. 5,651,712, entitled "Multi-Chromic Lateral Field Emission Devices With Associated Displays and Methods of Fabrication," incorporated herein by reference.

Waveguides can be used to transmit optical signals, for example, in connection with telecommunication signals. Waveguides can take the form of optical fibers, planar waveguides or the like. The printing approaches described herein can be used to form optical waveguides through the deposition of silica particle dispersions and the subsequent fusing of the particles into an optical structure. The approaches described herein are alternatives to chemical vapor deposition combined with photolithography and to Light Reactive Deposition (LRD™), as described in WO 02/32588 to Bi et al., entitled "Coating Formation by Reactive Deposition," incorporated herein by reference. The deposition approaches described herein can be used to form the waveguide cores that can be covered with a lower index-of-refraction cladding material, for example, using chemical vapor deposition or LRD™. With respect to alternative approaches to planar waveguide formation, the formation of planar waveguides by flame hydrolysis is described in U.S. Pat. No. 3,934,061 to Keck et al., entitled "Method of Forming Planar Optical Waveguides," incorporated herein by reference.

EXAMPLES

Example 1

SiO₂ dispersion in Methyl Ethyl Ketone (MEK)

This example demonstrates the dispersion and surface modification of silica particles synthesized using laser pyrolysis.

Figure 3:
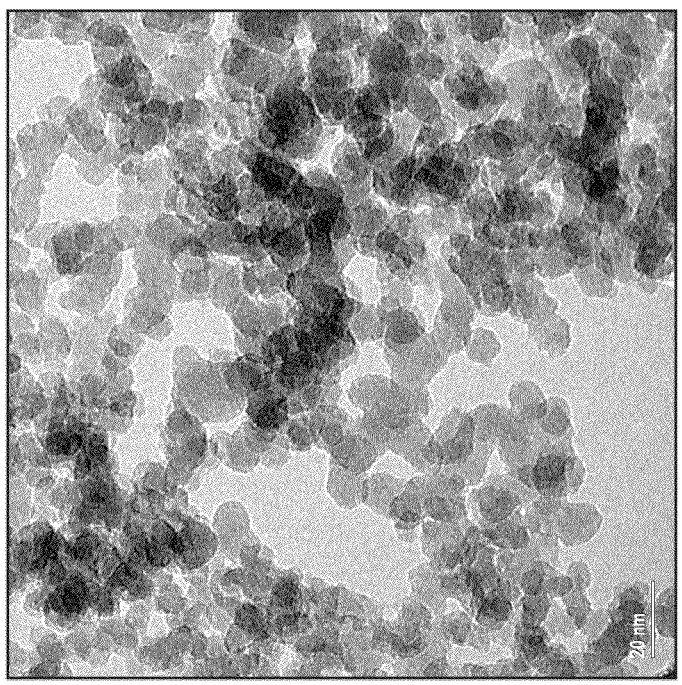
FIG. 3 is an x-ray micrograph of the sample of FIG. 2 taken at a greater magnification.
Figure 2:
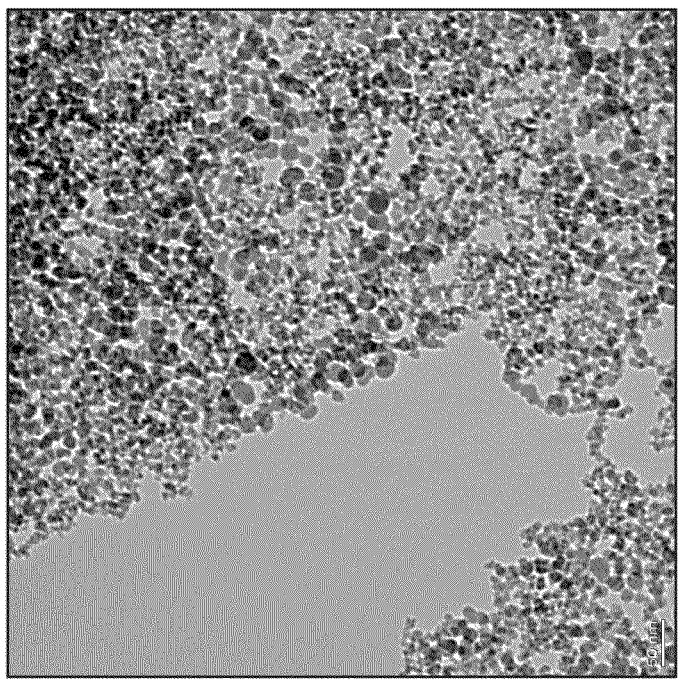
FIG. 2 is an x-ray micrograph of silica particles synthesized using laser pyrolysis with an aerosol tetraethoxysilane precursor in which the micrograph is taken at a first magnification.

SiO₂ was produced by laser pyrolysis aerosol) with Tetraethoxylsilane (TEOS) as the silicon precursor. The silicon precursor was delivered with as an aerosol with a mixture of ethylene, oxygen and an inert gas serving as the carrier gas. The apparatus was similar to the apparatus in FIGS. 6-8 of U.S. Pat. No. 6,849,334 to Home et al., entitled "Optical Materials and Optical Devices," incorporated herein by reference. The SiO₂ particles had a primary particle size as determined using a transmission electron micrograph of 10-20 nm. Transmission electron micrographs at two magnifications are shown in FIGS. 2 and 3, respectively, for a representative SiO₂ nanoparticle sample made from TEOS using laser pyrolysis.

Figure 4:
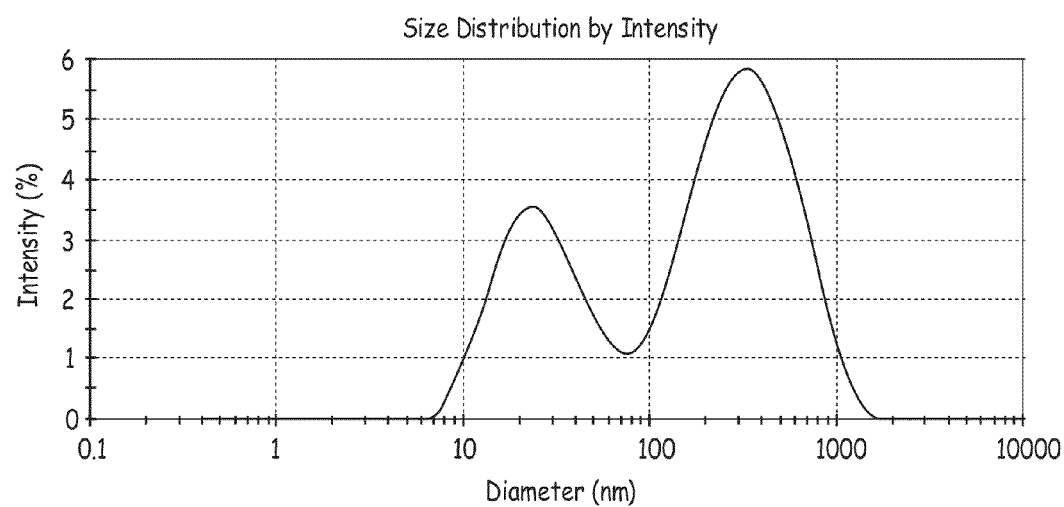
FIG. 4 is a plot of the size distribution of a dispersion of silica nanoparticles in methylethylketone liquid using dynamic light scattering to make the measurement.

SiO₂ powder (13.6 g, with a BET surface area >236.5 m²/g) was added to methylethylketone (MEK) to make a 5% wt mixture. The mixture was sonicated with a probe sonicator for 1-4 hours. Then, methacryloxypropyl trimethoxysilane (Z6030, 3.0 g-17.9 g, Dow Corning.) was added to the dispersion, and sonication was continued for 1-3 hr. The resultant secondary particles sizes were evaluated with dynamic light scattering (DLS) using a Malvern ZetaSizer™ instrument. The distribution of the size of the particles revealed from DLS measurement is shown in FIG. 4 where about 66% of the secondary particles had a diameter of 362.6 nm and 34% of the particles had a peak secondary particle size of about 28.1 nm. SiO₂ particles therefore form a good dispersion in MEK at 5% wt after modification with methacryloxypropyl trimethoxysilane.

Example 2

SiO₂ Dispersion in Isopropanol

This example demonstrated the dispersion of SiO₂ nanoparticles in isopropanol as an alternative dispersing liquid. The SiO₂ nanoparticles for this example had the same property as the nanoparticles in Example 1.

Figure 5:
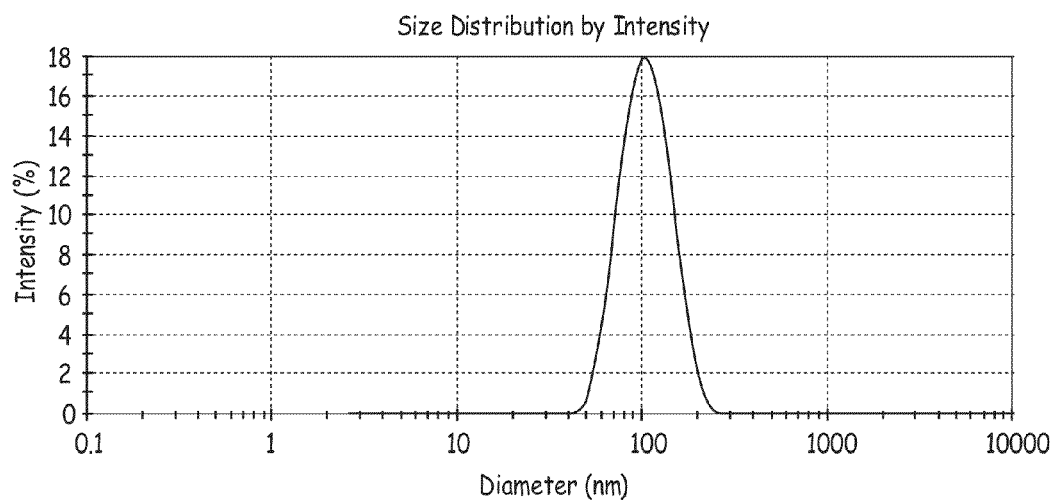
FIG. 5 is a plot of the size distribution of a dispersion of silica nanoparticles in isopropanol liquid using dynamic light scattering to make the measurement.

SiO₂ powder (1.0 g, with a BET surface area 214.0 m²/g) was added to isopropanol to make a 1% wt mixture. The mixture was sonicated in a bath sonicator for 1-4 hours. Then, N-(2-aminoethyl)-3-aminopropyltrimethoxysilane (0.32 g-1.94 g, Gelest, Inc.) was added to the dispersion and continue sonication for 1-7 hr at a temperature of 25° C.-60° C. The resultant secondary particles sizes were evaluated with dynamic light scattering (DLS) using a Malvern ZetaSizer™ instrument. The distribution of the size of the particles revealed from DLS measurement is shown in FIG. 5 where the particles had an average secondary particle size of about 99.7 nm. SiO₂ particles therefore form good dispersion in IPA at 1% wt after modification with N-(2-aminoethyl)-3-aminopropyltrimethoxysilane methacryloxypropyl trimethoxysilane.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A dispersion comprising a liquid and at least about 0.05 weight percent nanoparticles having an average primary particle size of no more than about 250 nm and a volume-average particle size of no more than about 500 nm, wherein the nanoparticles comprise a mixture of silica particles and silicon particles and wherein the silicon particles comprise a dopant.

2. The dispersion of claim 1 wherein the silicon particles comprise at least $1.0 \times 10^{17}$ to about 15 atomic percent dopant relative to the silicon atoms.

3. The dispersion of claim 1 wherein the dopant comprises phosphorous.

4. The dispersion of claim 1 wherein the dopant comprises boron.

5. The dispersion of claim 1 wherein the silica particles comprise a dopant.

6. The dispersion of claim 1 wherein the liquid comprises an alcohol.

7. The dispersion of claim 1 wherein the alcohol is selected from the group consisting of methanol, ethanol, propylene glycol, butanediol and mixtures thereof.

8. The dispersion of claim 1 wherein the nanoparticles are crystalline.

9. The dispersion of claim 1 wherein at least about 95 percent of the nanoparticles have a diameter greater than about 40 percent of the average diameter and less than about 250 percent of the average diameter.

10. The dispersion of claim 1 wherein the silica particles have an average primary particle size of from about 2 nm to about 100 nm.

11. The dispersion of claim 1 wherein the dispersion has a viscosity of about 0.5 mPa·s to about 100 mPa·s.

12. The dispersion of claim 1 wherein the dispersion has a surface tension from about 2.0 N/m$^2$ to about 6.0 N/m$^2$.

* * * * *